(12) United States Patent
Kaneko et al.

(10) Patent No.: US 7,998,308 B2
(45) Date of Patent: *Aug. 16, 2011

(54) LIQUID PROCESSING APPARATUS

(75) Inventors: Satoshi Kaneko, Koshi (JP); Kazuhisa Matsumoto, Koshi (JP); Norihiro Ito, Koshi (JP); Masami Akimoto, Koshi (JP); Takayuki Toshima, Koshi (JP); Hiromitsu Nanba, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 633 days.

This patent is subject to a terminal disclaimer.

(21) Appl. No.: 11/785,351

(22) Filed: Apr. 17, 2007

(65) Prior Publication Data
US 2007/0240824 A1      Oct. 18, 2007

(30) Foreign Application Priority Data

Apr. 18, 2006   (JP) .................................. 2006-114960

(51) Int. Cl.
*H01L 21/00* (2006.01)
*H01L 21/30* (2006.01)

(52) U.S. Cl. ..................... 156/345.55; 134/902; 134/119

(58) Field of Classification Search .................. 134/114, 134/119, 134, 149, 902; 156/345.55
See application file for complete search history.

(56) References Cited

U.S. PATENT DOCUMENTS

| | | | |
|---|---|---|---|
| 5,718,763 A * | 2/1998 | Tateyama et al. ............... | 118/52 |
| 5,997,653 A | 12/1999 | Yamasaka | |
| 6,660,098 B2 * | 12/2003 | Curtis et al. .................. | 118/730 |
| 6,793,769 B2 * | 9/2004 | Kajino et al. ............. | 156/345.55 |
| 6,827,814 B2 * | 12/2004 | Taniyama et al. ......... | 156/345.12 |
| 7,332,055 B2 * | 2/2008 | Orii et al. .................. | 156/345.17 |
| 2003/0168089 A1 | 9/2003 | Katakabe et al. | |
| 2003/0170988 A1 | 9/2003 | Izumi et al. | |
| 2004/0180141 A1 | 9/2004 | Kobayashi et al. | |
| 2007/0240824 A1 * | 10/2007 | Kaneko et al. ........... | 156/345.11 |
| 2007/0289528 A1 * | 12/2007 | Nanba et al. ..................... | 118/52 |
| 2010/0144158 A1 * | 6/2010 | Ito et al. ........................ | 438/758 |

FOREIGN PATENT DOCUMENTS

| | | |
|---|---|---|
| EP | 1 335 412 | 8/2003 |
| JP | 07-106233 | 4/1995 |
| JP | 8-1064 | 1/1996 |
| JP | 8-78368 | 3/1996 |

OTHER PUBLICATIONS

Copending Application, filed concurrently (Apr. 17, 2007), "Liquid Processing Apparatus".

* cited by examiner

*Primary Examiner* — Sylvia R. MacArthur
(74) *Attorney, Agent, or Firm* — Smith, Gambrell & Russell, LLP (57) ABSTRACT

A liquid processing apparatus includes a substrate holding member configured to rotate along with a substrate held thereon in a horizontal state; a rotary cup configured to surround the substrate and to rotate along with the substrate; a liquid supply mechanism configured to supply a process liquid onto at least a front surface of the substrate; and an exhaust/drain section configured to perform gas-exhausting and liquid-draining out of the rotary cup; and a guide member disposed to surround the substrate, having an upper surface to be substantially continued to the front surface of the substrate, and configured to rotate along with the substrate holding member and the rotary cup, such that a process liquid supplied onto the front surface of the substrate and thrown off from the substrate is guided by the upper surface of the guide member from the rotary cup to the exhaust/drain section.

12 Claims, 6 Drawing Sheets

FIG. 8

LIQUID PROCESSING APPARATUS

BACKGROUND OF THE INVENTION

1. Field of the Invention

The present invention relates to a liquid processing apparatus for performing a predetermined liquid process on a substrate, such as a semiconductor wafer. For example, this liquid process is a cleaning process for removing particles and/or contaminants deposited on a semiconductor wafer.

2. Description of the Related Art

In the process of manufacturing semiconductor devices or flat panel display devices (FPD), liquid processes are frequently used, in which a process liquid is supplied onto a target substrate, such as a semiconductor wafer or glass substrate. For example, processes of this kind encompass a cleaning process for removing particles and/or contaminants deposited on a substrate, and a coating process for applying a photo-resist liquid or development liquid in a photolithography stage.

As a liquid processing apparatus used for this purpose, the following apparatus is known. Specifically, a substrate, such as a semiconductor wafer, is held on a spin chuck, and a process liquid is supplied onto the front surface or front and back surfaces of the wafer, while the wafer is rotated. Consequently, a liquid film is formed on the front surface or front and back surfaces of the wafer, thereby performing a process.

In general, an apparatus of this kind is arranged to supply a process liquid onto the center of a wafer, and rotate the wafer to spread the process liquid outward, thereby forming a liquid film and throwing off the process liquid. A surrounding member, such as a cup, is disposed around the wafer to guide downward the process liquid thrown off from the wafer, so that the process liquid is swiftly drained. However, where a cup or the like is used, part of the process liquid may bounce back to the wafer as mist, and generate defects thereon, such as water marks and/or particles.

As a technique for preventing this problem, Jpn. Pat. Appln. KOKAI Publication No. 8-1064 discloses a technique which utilizes a process liquid receiving member to be rotated integratedly with rotary support means that rotates along with a substrate held thereon in a horizontal state. The process liquid receiving member receives a process liquid scattered around the substrate, and guides the process liquid outward to collect it.

According to this technique, the process liquid receiving member rotatable along with the substrate is disposed adjacent to the peripheral portion of the substrate. This arrangement is conceived to reliably collect the process liquid scattered around the substrate and to prevent the liquid from being re-deposited on the substrate.

However, even if the technique disclosed in Jpn. Pat. Appln. KOKAI Publication No. 8-1064 is adopted, the process may be adversely affected by mist to some extent. Particularly, in the case of a cleaning process, problems tend to arise during the ending period of a drying step after a cleaning step, such that drying becomes insufficient due to re-deposition of small droplets of mist and locally promoted vaporization of isopropyl alcohol (IPA) used for the drying step.

BRIEF SUMMARY OF THE INVENTION

An object of the present invention is to provide a liquid processing apparatus arranged to supply a process liquid onto a substrate while rotating the substrate, thereby performing a liquid process on the substrate, wherein mist of the process liquid is prevented from being scattered onto the substrate.

According to one aspect of the present invention, there is provided a liquid processing apparatus comprising: a substrate holding member configured to rotate along with a substrate held thereon in a horizontal state; a rotary cup configured to surround the substrate held on the substrate holding member and to rotate along with the substrate; a rotation mechanism configured to integratedly rotate the rotary cup and the substrate holding member; a liquid supply mechanism configured to supply a process liquid onto at least a front surface of the substrate; an exhaust/drain section configured to perform gas-exhausting and liquid-draining out of the rotary cup; and a guide member disposed to surround the substrate, having an upper surface to be substantially continued to the front surface of the substrate, and configured to rotate along with the substrate holding member and the rotary cup, such that a process liquid supplied onto the front surface of the substrate and thrown off from the substrate is guided by the upper surface of the guide member from the rotary cup to the exhaust/drain section.

According to another aspect of the present invention, there is provided a liquid processing apparatus comprising: a substrate holding member configured to rotate along with a substrate held thereon in a horizontal state; a rotary cup configured to surround the substrate held on the substrate holding member and to rotate along with the substrate; a rotation mechanism configured to integratedly rotate the rotary cup and the substrate holding member; a front surface liquid supply mechanism configured to supply a process liquid onto a front surface of the substrate; a back surface liquid supply mechanism configured to supply a process liquid onto a back surface of the substrate; an exhaust/drain section configured to perform gas-exhausting and liquid-draining out of the rotary cup; and a guide member disposed to surround the substrate, having upper and lower surfaces to be substantially continued to the front and back surfaces of the substrate, respectively, and configured to rotate along with the substrate holding member and the rotary cup, such that a process liquid supplied onto the front surface of the substrate and thrown off from the substrate is guided by the upper surface of the guide member from the rotary cup to the exhaust/drain section, and a process liquid supplied onto the back surface of the substrate and thrown off from the substrate is guided by the lower surface of the guide member from the rotary cup to the exhaust/drain section.

The inventors of the present invention studied problems in this field and have arrived at the findings given below. Specifically, when a process liquid is separated from a substrate by rotation of the substrate, the flow of the liquid is suddenly changed from a laminar flow state to an uneven flow state near the peripheral edge of the substrate, due to causes, such as an effect of interfacial tension at the peripheral edge of the substrate. Consequently, the flow of gas also tends to become turbulent near the peripheral edge of the substrate and generate mist of the liquid. The present invention is conceived to solve this problem.

Specifically, according to the present invention, since the rotary cup is rotated along with the substrate, a centrifugal force acts on the rotary cup, so mist of a process liquid is inhibited from bouncing back, unlike a case where a stationary cup is used for the same purpose. Further, a process liquid thrown off from the front surface or the front and back surfaces of the substrate is guided in a laminar flow state by the guide member from the rotary cup to the exhaust/drain section. In this case, the process liquid is inhibited from being turned into mist when the process liquid is thrown off from the substrate. Consequently, it is possible to prevent mist of the process liquid from being scattered on and around the substrate during a liquid process in a most effective way.

DETAILED DESCRIPTION OF THE INVENTION

Embodiments of the present invention will now be described with reference to the accompanying drawings. Hereinafter, an explanation will be given of a case where the present invention is applied to a liquid processing apparatus that can perform a cleaning process on the front and back surfaces of a semiconductor wafer (which will be simply referred to as "wafer", hereinafter).

Figure 1:
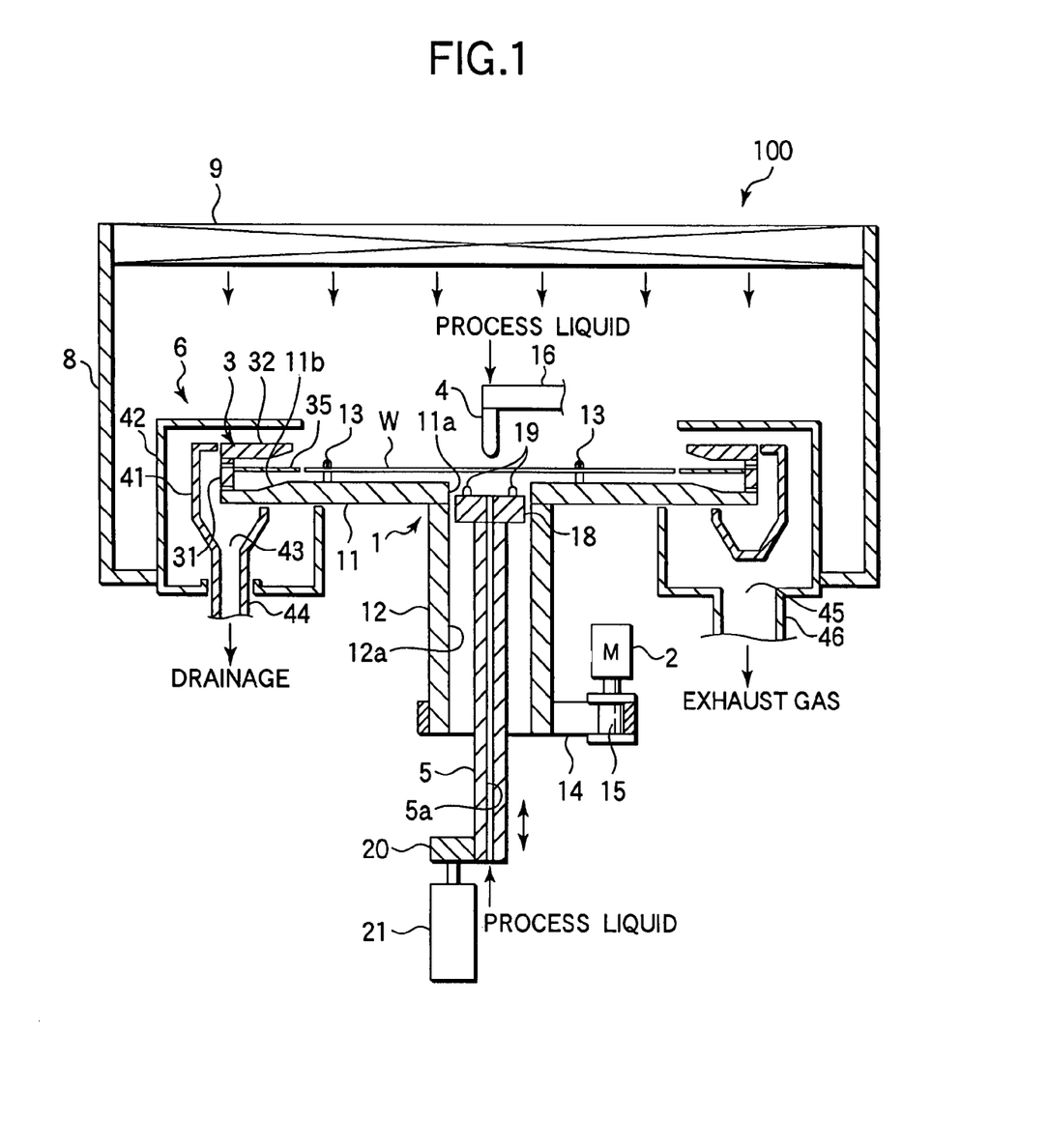
FIG. 1 is a sectional view schematically showing the structure of a liquid processing apparatus according to a first embodiment of the present invention.
Figure 2:
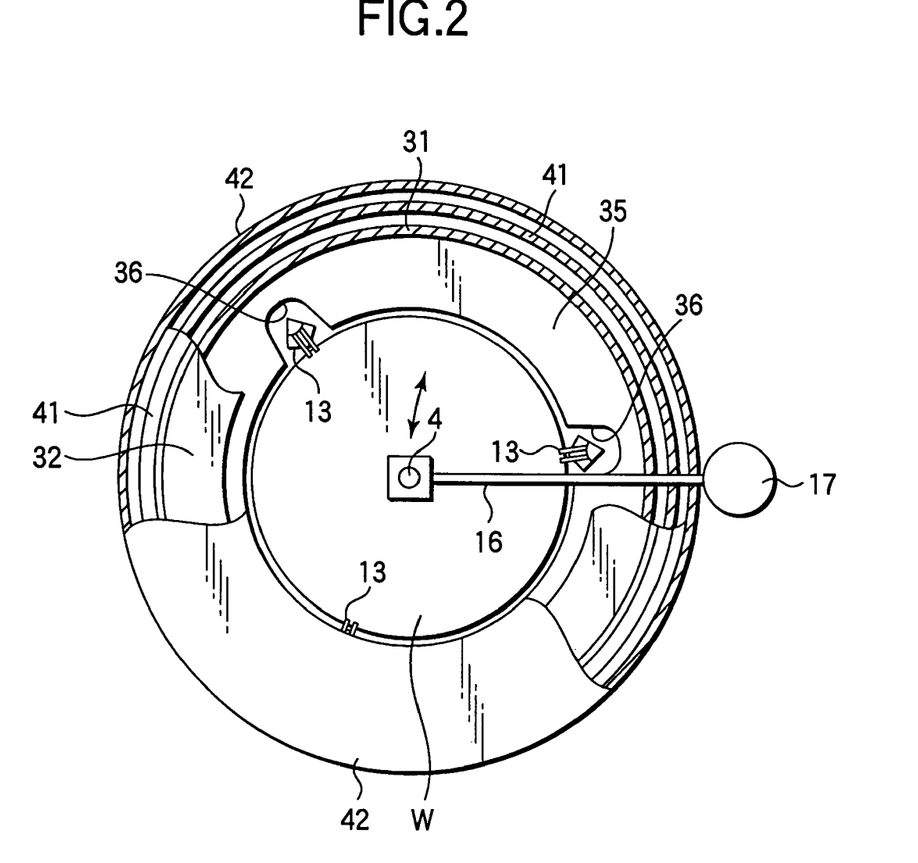
FIG. 2 is a partially sectional plan view schematically showing the liquid processing apparatus according to the first embodiment of the present invention.
Figure 3:
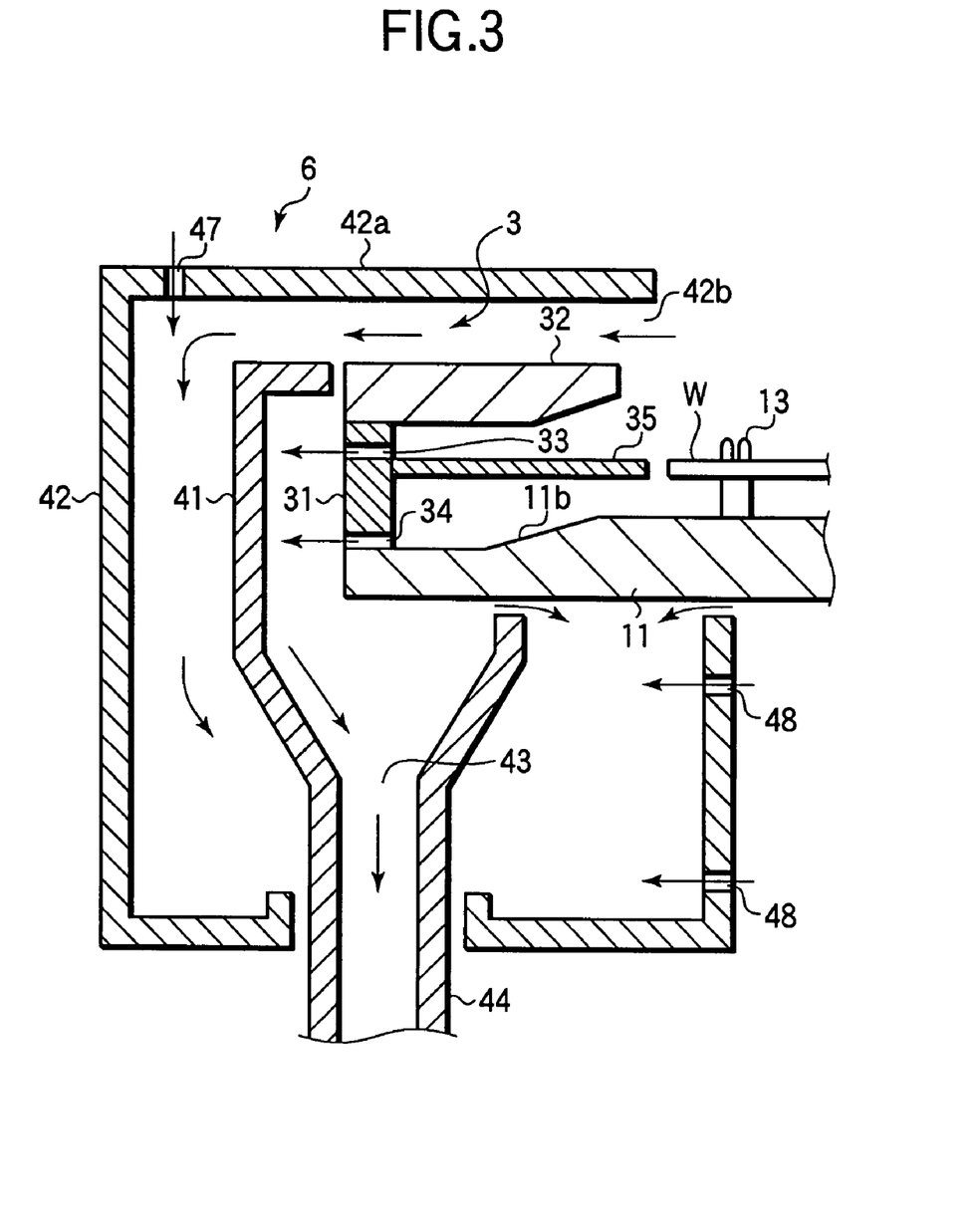
FIG. 3 is an enlarged sectional view showing a main part of the liquid processing apparatus shown in FIG. 1.

FIG. 1 is a sectional view schematically showing the structure of a liquid processing apparatus according to a first embodiment of the present invention. FIG. 2 is a plan view thereof, and FIG. 3 is an enlarged sectional view showing a main part thereof. This liquid processing apparatus 100 includes a wafer holding member 1 for rotatably holding a target substrate or wafer W. The wafer holding member 1 is rotatable by a rotary motor 2. A rotary cup 3 is disposed around the wafer W held on the wafer holding member 1 and configured to rotate along with the wafer holding member 1. The liquid processing apparatus 100 further includes a front surface process liquid supply nozzle 4 for supplying a process liquid onto the front surface of the wafer W, and a back surface process liquid supply nozzle 5 for supplying a process liquid onto the back surface of the wafer W. Further, an exhaust/drain section 6 is disposed around the rotary cup 3. A casing 8 is disposed to cover the area around the exhaust/drain section 6 and the area above the wafer W. The casing 8 is provided with a fan/filter unit (FFU) 9 at the top, so that clean air is supplied as a down flow onto the wafer W held on the wafer holding member 1.

The wafer holding member 1 includes a rotary plate 11 formed of a circular plate set in a horizontal state. The center of the bottom of the rotary plate 11 is connected to a cylindrical rotary shaft 12 extending vertically downward. The rotary plate 11 has a circular opening 11a at the center, which communicates with a bore 12a formed inside the rotary shaft 12. The back surface process liquid supply nozzle 5 is movable up and down through the bore 12a and opening 11a. As shown in FIG. 2, the rotary plate 11 is provided with three holding pieces 13 disposed at regular intervals for holding the outer edge of the wafer W. The holding pieces 13 are configured to hold the wafer W in a horizontal state such that the wafer W is slightly separated from the rotary plate 11. Each of the holding pieces 13 is movable by rotation between a hold position for holding the wafer W, and a release position on an outer side for releasing the wafer W. The rotary plate 11 has an inclined portion 11b extending in the annular direction near the outer edge such that the peripheral side is lower than the central side. Accordingly, the peripheral portion of the rotary plate 11 is thinner than the other portions.

A belt 14 is wound around between the lower end of the rotary shaft 12 and a pulley 15 rotatable by the motor 2. The rotary shaft 12 is rotated through the pulley 15 and belt 14 by rotation of the motor 2.

The front surface process liquid supply nozzle 4 is supported at the distal end of a nozzle arm 16. A process liquid is supplied through a liquid supply tube (not shown) into a nozzle hole formed in the nozzle 4 and is then delivered from the nozzle 4. For example, the process liquid thus delivered encompasses a cleaning chemical solution, a rising liquid such as purified water, and a drying solvent such as IPA. In other words, the nozzle 4 is configured to selectively deliver process liquids of one, two, or more types. As shown in FIG. 2, the nozzle arm 16 is rotatable about a shaft 17 used as a central axis, and is movable by a driving mechanism (not shown) between a delivery position above the center of the wafer W and a retreat position outside the wafer W. Further, the nozzle arm 16 is movable up and down, such that it is set at an upper position when it is rotated, and at a lower position when a process liquid is delivered from the front surface process liquid supply nozzle 4.

The back surface process liquid supply nozzle 5 has a nozzle hole 5a formed therein and extending in the longitudinal direction. A predetermined process liquid is supplied through a process liquid tube (not shown) into the nozzle hole 5a from below and is then delivered from the nozzle hole 5a onto the back surface of the wafer W. For example, the process liquid thus delivered encompasses a cleaning chemical solution, a rising liquid such as purified water, and a drying solvent such as IPA, as in the front surface process liquid supply nozzle 4. In other words, the nozzle 5 is configured to selectively deliver process liquids of one, two, or more types. The back surface process liquid supply nozzle 5 also serves as a wafer lifting member, and thus has a wafer support head 18 at the top for supporting the wafer W. The wafer support head 18 is provided with three wafer support pins 19 for supporting the wafer W (only two of them are shown) on the upper surface. The lower end of the back surface process liquid supply nozzle 5 is connected to a cylinder mechanism 21 through a connector 20. The back surface process liquid supply nozzle 5 is movable up and down by the cylinder mechanism 21 to move up and down the wafer W for loading and unloading the wafer W.

As shown in FIG. 3, the rotary cup 3 includes a cylindrical vertical wall portion 31 that extends upward from the end of the rotary plate 11 to form a vertical wall. An annular eaves portion 32 extends inward from the upper end of the vertical wall portion 31.

The vertical wall portion 31 is provided with an annular and plate-like guide member 35 at a height essentially the same as the wafer W, which extends inward to a position near the peripheral edge of the wafer W. In other words, the guide member 35 is arranged such that the upper and lower surfaces thereof are to be almost continued to the front and back surfaces of the wafer W. The vertical wall portion 31 has a plurality of discharge holes 33 and 34 respectively at positions above and below the guide member 35. The discharge holes 33 and 34 are arrayed in the annular direction and penetrate the vertical wall portion 31 from inside to outside.

The discharge holes 33 are arranged such that the bottom surface thereof is leveled with the upper surface of the guide member 35. The discharge holes 34 are arranged such that the bottom surface thereof is leveled with the upper surface of the rotary plate 11. When a process liquid is supplied onto the center of the front surface of the wafer W from the front surface process liquid supply nozzle 4 while the wafer holding member 1 and rotary cup 3 are rotated along with the wafer W by the motor 2, the process liquid is spread by a centrifugal force on the front surface of the wafer W and is thrown off from the peripheral edge of the wafer W. The process liquid thus thrown off from the front surface of the wafer W is guided to the vertical wall portion 31 by the upper surface of the guide member 35 almost continued thereto. Then, the process liquid is discharged through the discharge holes 33 out of the rotary cup 3 by a centrifugal force. Similarly, when a process liquid is supplied onto the center of the back surface of the wafer W from the back surface process liquid supply nozzle 5 while the wafer holding member 1 and rotary cup 3 are rotated along with the wafer W, the process liquid is spread by a centrifugal force on the back surface of the wafer W and is thrown off from the peripheral edge of the wafer W. The process liquid thus thrown off from the back surface of the wafer W is guided to the vertical wall portion 31 by the lower surface of the guide member 35 almost continued thereto. Then, the process liquid is discharged through the discharge holes 34 out of the rotary cup 3 by a centrifugal force. At this time, since a centrifugal force acts on the vertical wall portion 31, mist of the process liquid is inhibited from returning inward.

Further, since the process liquid thrown off from the front and back surfaces of the wafer W is guided by the guide member 35, the process liquid separated from the peripheral edge of the wafer W can hardly become turbulent. In this case, it is possible to guide the process liquid out of the rotary cup while preventing the process liquid from being turned into mist. As described above, the guide member 35 is disposed to prevent the process liquid thrown off from the front and back surfaces of the wafer W from being turned into mist. Accordingly, the upper and lower surfaces of the guide member 35 are required to have certain continuity relative to the front and back surfaces of the wafer W such that the process liquid thrown off from the front and back surfaces of the wafer W is guided without scattering mist. Particularly, the portions of the upper and lower surfaces of the guide member 35 adjacent to the wafer W preferably have the same height levels as those of the front and back surfaces of the wafer W. As shown in FIG. 2, the guide member 35 has notches 36 at positions corresponding to the wafer holding pieces 13 to accept the wafer holding pieces 13.

The exhaust/drain section 6 is mainly used for collecting exhaust gas and drainage discharged from the space surrounded by the rotary plate 11 and rotary cup 3. As shown in the enlarged view of FIG. 3, the exhaust/drain section 6 includes an annular drain cup 41 and an annular exhaust cup 42. The annular drain cup 41 is disposed to receive drainage discharged from the discharge holes 33 and 34 of the vertical wall portion 31 of the rotary cup 3. The annular exhaust cup 42 is disposed to surround the drain cup 41. The drain cup 41 has a drain port 43 formed in the bottom at one position and connected to a drain tube 44. The drain tube 44 is connected to a suction mechanism (not shown) on the downstream side, so that drainage gathered from the rotary cup 3 into the drain cup 41 is swiftly discharged through the drain port 43 and drain tube 44 and is then discarded or recycled. In place of a single drain port 43, a plurality of drain ports 43 may be used.

The exhaust cup 42 surrounds the rotary cup 3 as well and has an upper wall 42a above the eaves portion 32. The exhaust cup 42 is used for collecting and exhausting gas through an opening 42b formed between the upper wall 42a and eaves portion 32. The exhaust cup 42 has exhaust ports 45 formed in the bottom and each connected to an exhaust tube 46. The exhaust tube 46 is connected to a suction mechanism (not shown) on the downstream side, so that gas is exhausted from around the rotary cup 3. The plurality of exhaust ports 45 can be selectively used by switching in accordance with the types of process liquids. As shown in FIG. 3, the exhaust cup 42 has a plurality of air introducing ports 47 formed in the upper wall and arrayed in the annular direction. The exhaust cup 42 further has a plurality of air introducing ports 48 formed in the inner wall and arrayed in upper and lower rows extending in the annular direction. The air introducing ports 47 are used for collecting gas above the exhaust cup 42, and the air introducing ports 48 is used for collecting gas in a mechanism section present below the rotary plate 11, so as to remove gasified components of remaining process liquids. Since the exhaust cup 42 is disposed to surround the drain cup 41, it is possible to reliably collect mist of process liquids leaked out of the drain cup 41, thereby preventing the mist from diffusing outside.

Figure 4A:
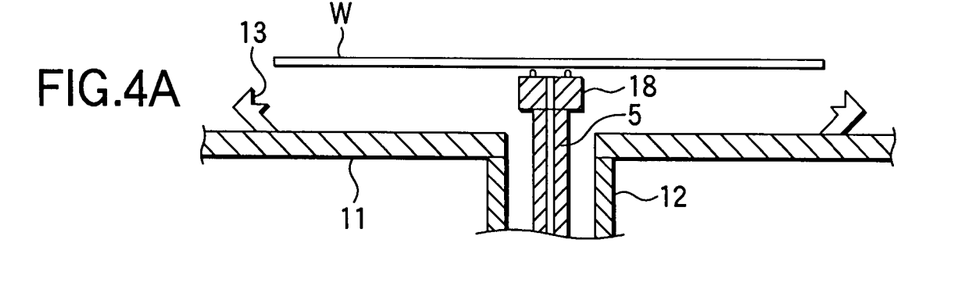
FIGS. 4A to 4D are views for explaining an operation of the liquid processing apparatus according to the first embodiment of the present invention.
Figure 4B:
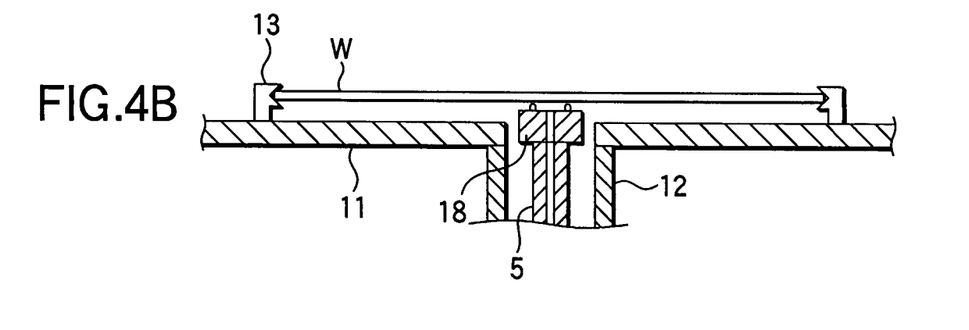
Figure 4C:
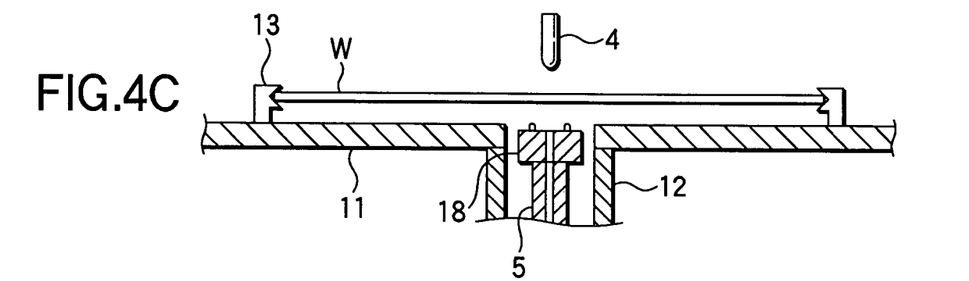

Next, an explanation will be given, with reference to FIGS. 4A to 4D, of an operation of the liquid processing apparatus 100 having the structure described above. At first, as shown in FIG. 4A, the back surface process liquid supply nozzle 5 is set at the upper position, and a wafer W is transferred from a transfer arm (not shown) onto the support pins of the wafer support head 18. Then, as shown in FIG. 4B, the back surface process liquid supply nozzle 5 is moved down to a position where the wafer W can be held by the holding pieces 13, and then the wafer W is chucked by the holding pieces 13. Then, as shown in FIG. 4C, the front surface process liquid supply nozzle 4 is moved from the retreat position to the delivery position above the center of the wafer W.

Figure 4D:
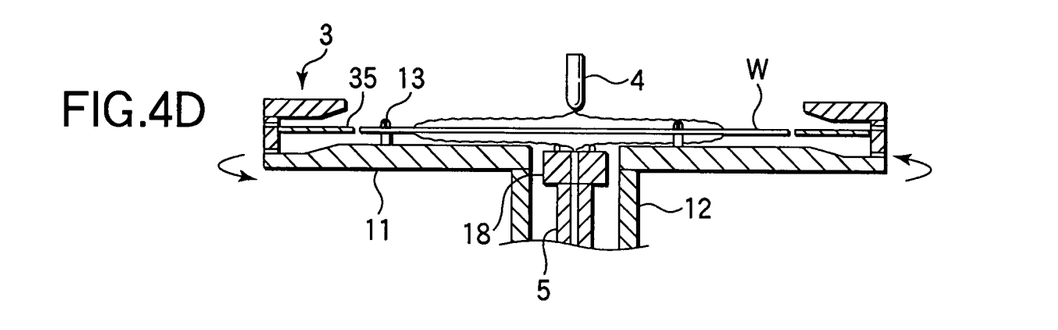

In this state, as shown in FIG. 4D, while the holding member 1 is rotated along with the rotary cup 3 and wafer W by the motor 2, a predetermined process liquid is supplied from the front surface process liquid supply nozzle 4 and back surface process liquid supply nozzle 5 to perform a cleaning process.

Figure 5:
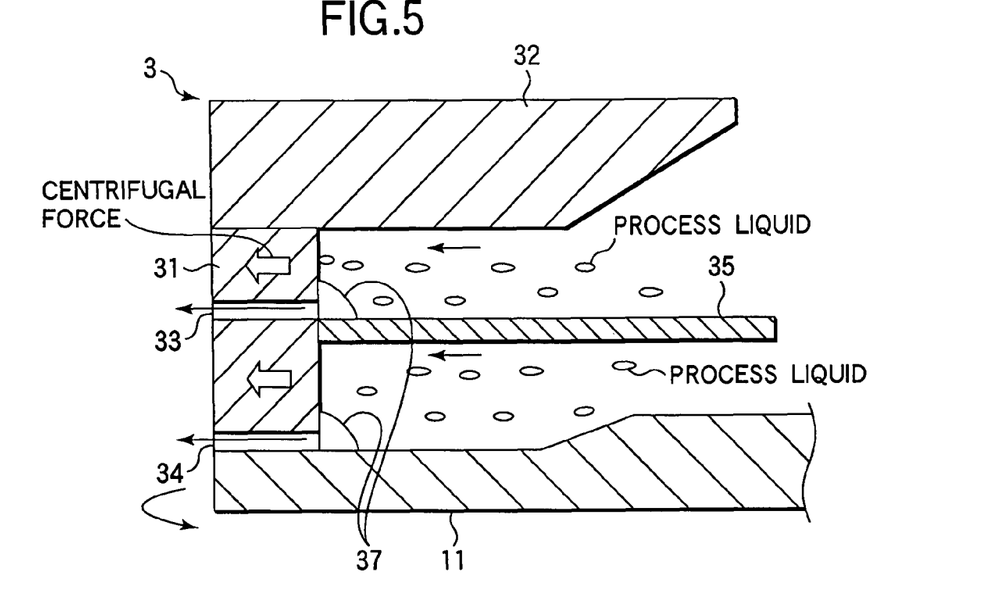
FIG. 5 is a view for explaining a state of a process liquid thrown off from a wafer.

In this cleaning process, the process liquid is supplied onto the center of the front surface and back surface of the wafer W, and is spread by a centrifugal force outward on the wafer W and thrown off from the peripheral edge of the wafer W. The cup surrounding the wafer W used in this process is the rotary cup 3 that is rotated along with the wafer W. Accordingly, as shown in FIG. 5, when the process liquid thrown off from the wafer W hits against the vertical wall portion 31, a centrifugal force acts on the process liquid and forms a liquid film 37 around the discharge holes 33 and 34 of the vertical wall portion 31. In this case, the process liquid is inhibited from being scattered (turned into mist), unlike a case where a stationary cup is used for the same purpose. Then, the process liquid is discharged from the vertical wall portion 31 through the discharge holes 33 and 34 out of the rotary cup 3 by a centrifugal force. Consequently, it is possible to suppress such a problem caused by a stationary cup that a process liquid hitting against the cup is turned into mist and returns to the wafer W. After supply of the process liquid is stopped, part of the process liquid remaining as the liquid film 37 around the discharge holes 33 and 34 of the vertical wall portion 31 is also discharged through the discharge holes 33 and 34, so no process liquid remains in the rotary cup 3.

Figure 6:
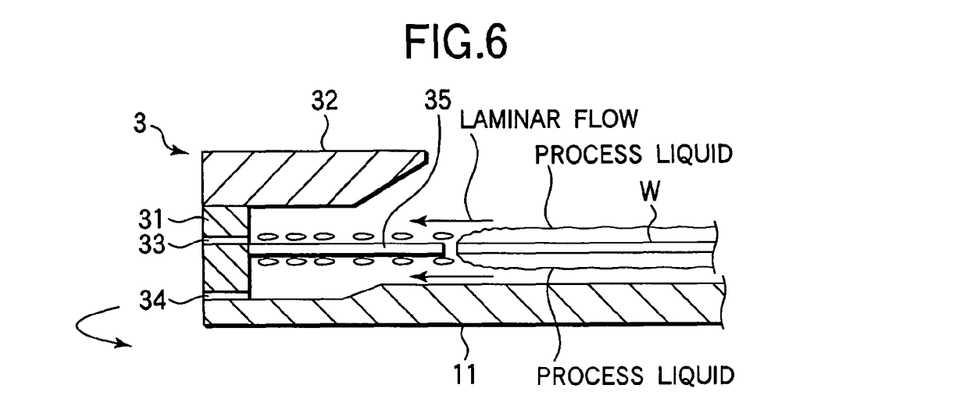
FIG. 6 is a view for explaining an effect of a guide member.

The upper and lower surfaces of the guide member 35 are almost continued to the front and back surfaces of the wafer W. Accordingly, as shown in FIG. 6, when a process liquid is thrown off from the front and back surfaces of the wafer W through the peripheral edge by a centrifugal force, the liquid is guided to the vertical wall portion 31 in a laminar flow state by the upper and lower surfaces of the guide member 35, and is then discharged outside through the discharge holes 33 and 34. With this arrangement, the process liquid is effectively prevented from being turned into mist, when it is thrown off from the wafer W.

Figure 7:
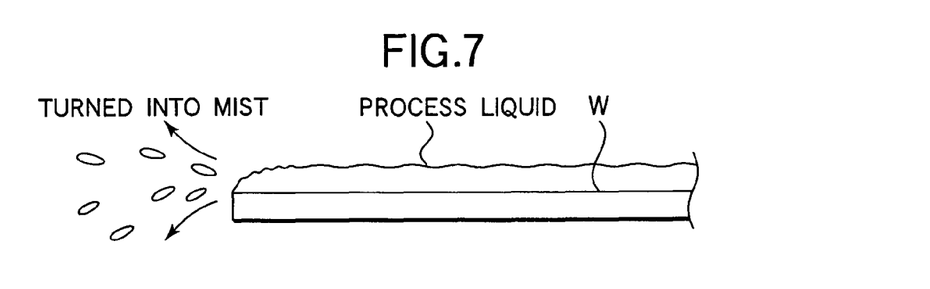
FIG. 7 is a view for explaining a state of a process liquid thrown off from a wafer, where no guide member is present.

As shown in FIG. 7, where no guide member 35 is present, a process liquid separated from the peripheral edge of a wafer W easily becomes turbulent and is turned into mist due to causes, such as an effect of interfacial tension at the peripheral edge of the wafer W. This problem is solved by the guide member 35 disposed as described above, because the guide member 35 prevents the process liquid from becoming turbulent and thereby prevents it from being turned into mist.

As described above, due to a synergistic action of the rotary cup 3 with the guide member 35, it is possible to prevent mist of a process liquid from being scattered near the wafer W in a most effective way.

According to the structure of the apparatus shown in FIG. 1, a process liquid once discharged out of the rotary cup 3 may bounce back as mist from the wall of the drain cup 41 to the rotary cup 3. However, since the liquid film 37 is formed on the inner surface of the vertical wall portion 31, the mist can hardly reach the inside of the rotary cup 3. Accordingly, there is no need to consider contamination of the wafer W due to mist generated inside the drain cup 41, so the drain cup 41 can be smaller, thereby making the apparatus compact.

Further, even if the size of the drain cup 41 is decreased, the exhaust cup 42 disposed to surround the drain cup 41 can trap mist leaked out of the drain cup 41, so the mist is prevented from being scattered out of the apparatus.

Next, an explanation will be given of a liquid processing apparatus according to a second embodiment of the present invention.

Figure 8:
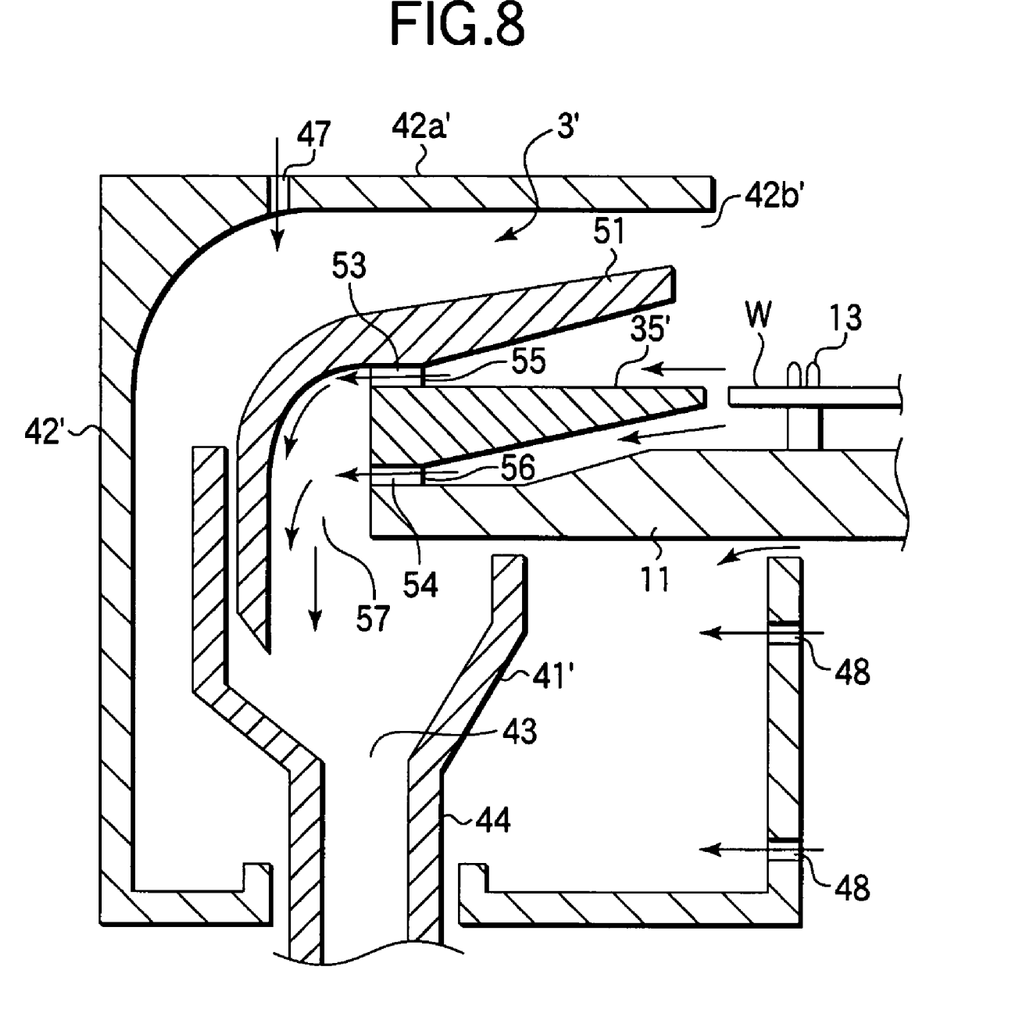
FIG. 8 is an enlarged sectional view showing a main part of a liquid processing apparatus according to a second embodiment of the present invention.

FIG. 8 is an enlarged sectional view showing a main part of the liquid processing apparatus according to the second embodiment of the present invention. This embodiment differs from the first embodiment in the arrangement of the guide member, rotary cup, and exhaust/drain section. The following explanation will be focused on these differences, and the portions excluded from the explanation are arranged essentially the same as those of the first embodiment.

In this embodiment, a rotary cup 3' configured to guide drainage downward is used in place of the rotary cup 3 of the first embodiment. Further, a guide member 35' having a lower surface inclined outward and downward is used in place of the guide member 35. Due to such different structures, a drain cup 41' employed here has a structure slightly different from the drain cup 41. Further, an exhaust cup 42' having a structure different from the exhaust cup 42 is disposed to easily guide exhaust gas to the exhaust tube (not shown).

Specifically, the rotary cup 3' includes a eaves portion 51 configured to prevent a process liquid thrown off from the wafer W from being scattered and to guide the process liquid downward. A plurality of spacers 55 and 56 are interposed between the eaves portion 51 and guide member 35' and between the guide member 35' and rotary plate 11 to form slits 53 and 54 for allowing process liquids to pass therethrough. The eaves portion 51, spacers 55, guide member 35', spacers 56, and rotary plate 11 are integratedly fixed to each other by screws or the like, so that they can be integratedly rotated. Each set of a plurality of spacers 55 and a plurality of spacers 56 are arrayed in the annular direction, so that each set of a plurality of slits 53 and a plurality of slits 54 are arrayed in the annular direction. In place of these spacers, a place having holes formed therein may be used, as in the first embodiment.

The eaves portion 51 has an inner surface curved outward and downward, and extends to its lower end located below the rotary plate 11. An annular opening 57 is formed downward between the lower end of the eaves portion 51 and the rotary plate 11, i.e., at the lower end of the rotary cup 3' to discharge drainage downward. The drain cup 41' is disposed to receive this opening 57, i.e., to surround the opening 57. Where the eaves portion 51 extends to its lower end located below the rotary plate 11, the portion for discharging drainage from the rotary cup 3' becomes distant from the wafer W, thereby decreasing return of the mist. In light of this, the lower end of the eaves portion 51 is preferably set downward as far as possible, so that it is more distant from the wafer W. Except for this portion for receiving drainage, the drain cup 41' is essentially the same as the drain cup 41 such that it includes a drain port 43 connected to a drain tube 44.

The eaves portion 51 has an outer surface inclined outward and downward, which is continued to a curved surface extending downward. In accordance with the inclination of the eaves portion 51, the exhaust cup 42' has an upper wall 42a' inclined outward and downward, which is continued to a curved surface extending downward. With this arrangement, gas collected through an opening 42b' formed between the upper wall 42a' and eaves portion 51 is easily guided to an exhaust tube (not shown).

According to the liquid processing apparatus having the structure described above, as in the first embodiment, while the holding member 1 is rotated along with the rotary cup 3' and wafer W by the motor 2, a predetermined process liquid is supplied from the front surface process liquid supply nozzle 4 and back surface process liquid supply nozzle 5 to perform a cleaning process. When the process liquid is thrown off from the front and back surfaces of the wafer W through the peripheral edge, the liquid is guided by the upper and lower surfaces of the guide member 35'. Then, the process liquid is forced to flow through the slits 53 and 54, and is guided downward by the inner wall of the eaves portion 51. Then, the process liquid is discharged downward from the annular opening 57 formed at the lower end of the rotary cup 3' into the drain cup 41'. In this embodiment, the guide member 35' provides the same function as that of the guide member 35 of the first embodiment, so the process liquid is guided from the rotary cup 3' to the drain cup 41' without becoming turbulent. Further, in this embodiment, since the process liquid is guided from the lower end of the rotary cup 3' into the drain cup 41' therebelow, even if the process liquid is turned into mist in the drain cup 41', the mist scarcely affects the wafer W, because the position of the mist is distant from the wafer W.

The present invention is not limited to the embodiments described above, and it may be modified in various manners. For example, the embodiments described above are exemplified by a liquid processing apparatus for cleaning the front and back surfaces of a wafer. However, the present invention may be applied to a liquid processing apparatus for cleaning only the front surface of a wafer. Further, in place of a cleaning process, the present invention may be applied to a liquid processing apparatus for performing another liquid process, such as a resist liquid coating process and/or a subsequent development process. In the embodiments described above, the target object is exemplified by a semiconductor wafer, but the present invention may be applied to another substrate, such as a substrate for flat panel display devices (FPD), a representative of which is a glass substrate for liquid crystal display devices (LCD).

What is claimed is:

1. A liquid processing apparatus comprising:
a substrate holding member configured to rotate along with a substrate held thereon in a horizontal state;
a rotary cup configured to surround the substrate held on the substrate holding member and to rotate along with the substrate;
a rotation mechanism configured to integratedly rotate the rotary cup and the substrate holding member;
a liquid supply mechanism configured to supply a process liquid onto at least a front surface of the substrate;
an exhaust/drain section configured to perform gas-exhausting and liquid-draining out of the rotary cup; and
an annular guide member disposed to surround the substrate, having an upper surface to be substantially continued to the front surface of the substrate,
wherein the guide member and the substrate holding member are arranged such that when the substrate is placed upon the substrate holding member, a portion of the guide member's upper surface adjacent to the substrate has essentially the same height level as that of the front surface of the substrate,
wherein the rotary cup further includes an annular eaves portion disposed above the guide member and extending inwardly, and
wherein, the rotation mechanism also rotates the guide member and the annular eaves portion integratedly with the substrate holding member and the rotary cup, such that a process liquid supplied onto the front surface of the substrate and thrown off from the substrate is guided radially outward by the upper surface of the guide member below the eaves portion and flows from the rotary cup to the exhaust/drain section.

2. The liquid processing apparatus according to claim 1, wherein the guide member comprises an annular plate body having an inner end adjacent to the substrate.

3. The liquid processing apparatus according to claim 1, wherein the rotary cup comprises a process liquid discharge portion configured to discharge in a horizontal direction a process liquid thrown off from the substrate.

4. The liquid processing apparatus according to claim 1, wherein the rotary cup comprises a guide wall integrally formed with the eaves portion to guide downward a process liquid thrown off from the substrate, and defining an opening configured to discharge downward the process liquid thus guided.

5. The liquid processing apparatus according to claim 1, wherein the exhaust/drain section comprises an annular drain cup configured to receive drainage thrown off from the substrate, and an exhaust cup disposed outside the drain cup and configured to discharge gas from the rotary cup.

6. The liquid processing apparatus according to claim 5, wherein the exhaust cup includes an upper wall above the eaves portion and is configured to collect and exhaust gas through an opening formed between the upper wall and the eaves portion.

7. A liquid processing apparatus comprising:
a substrate holding member configured to rotate along with a substrate held thereon in a horizontal state;
a rotary cup configured to surround the substrate held on the substrate holding member and to rotate along with the substrate;
a rotation mechanism configured to integratedly rotate the rotary cup and the substrate holding member;
a front surface liquid supply mechanism configured to supply a process liquid onto a front surface of the substrate;
a back surface liquid supply mechanism configured to supply a process liquid onto a back surface of the substrate;
an exhaust/drain section configured to perform gas-exhausting and liquid-draining out of the rotary cup; and
an annular guide member and the substrate holding member are arranged such that when the substrate is placed upon the substrate holding member the upper and lower surfaces of the annular guide member are substantially continued to the front and back surfaces of the substrate, respectively,
and the portions of the upper and lower surfaces adjacent to the substrate have essentially the same height levels as those of the front and back surfaces of the substrate,
wherein the rotary cup further includes an annular eaves portion disposed above the guide member and extending inwardly, and
wherein the rotation mechanism also rotates the guide member and the annular eaves portion integratedly with the substrate holding member and the rotary cup, such that a process liquid supplied onto the front surface of the substrate and thrown off from the substrate is guided radially outward by the upper surface of the guide member below the eaves portion and flows from the rotary cup to the exhaust/drain section, and a process liquid supplied onto the back surface of the substrate and thrown off from the substrate is guided radially outward by the lower surface of the guide member and flows from the rotary cup to the exhaust/drain section.

8. The liquid processing apparatus according to claim 7, wherein the guide member comprises an annular plate body having an inner end adjacent to the substrate.

9. The liquid processing apparatus according to claim 7, wherein the rotary cup comprises a process liquid discharge portion configured to discharge in a horizontal direction a process liquid thrown off from the substrate.

10. The liquid processing apparatus according to claim 7, wherein the rotary cup comprises a guide wall integrally formed with the eaves portion to guide downward a process liquid thrown off from the substrate, and defining an opening configured to discharge downward the process liquid thus guided.

11. The liquid processing apparatus according to claim 7, wherein the exhaust/drain section comprises an annular drain cup configured to receive drainage thrown off from the substrate, and an exhaust cup disposed outside the drain cup and configured to discharge gas from the rotary cup.

12. The liquid processing apparatus according to claim 11, wherein the exhaust cup includes an upper wall above the eaves portion and is configured to collect and exhaust gas through an opening formed between the upper wall and the eaves portion.

* * * * *